US006664565B1

(12) United States Patent
Sano et al.

(10) Patent No.: US 6,664,565 B1
(45) Date of Patent: Dec. 16, 2003

(54) ZNO CRYSTAL GROWTH METHOD, ZNO CRYSTAL STRUCTURE, AND SEMICONDUCTOR DEVICE USING ZNO CRYSTAL

(75) Inventors: Michihiro Sano, Odawara (JP); Takafumi Yao, c/o Institute for Materials Research, Tohoku University, 2-1-1 Katahira, Aoba-ku, Sendai-shi, Miyagi (JP)

(73) Assignees: Stanley Electric Co., Ltd., Tokyo (JP); Takafumi Yao, Sendai (JP)

( * ) Notice: Subject to any disclaimer, the term of this patent is extended or adjusted under 35 U.S.C. 154(b) by 160 days.

(21) Appl. No.: 09/648,046

(22) Filed: Aug. 25, 2000

(30) Foreign Application Priority Data

Aug. 31, 1999 (JP) ............................................. 11-245220

(51) Int. Cl.[7] .......................... H01L 29/12; H01L 33/00
(52) U.S. Cl. ............................. 257/43; 257/94; 438/85; 438/86; 117/84; 117/89; 372/45; 372/46
(58) Field of Search .............................. 257/43, 94, 96, 257/97, 98; 438/85, 86, 104, 754, 22, 34; 372/45, 46; 117/84, 89, 92, 103, 108, 944

(56) References Cited

U.S. PATENT DOCUMENTS 6,291,085 B1 * 9/2001 White et al. ................. 428/642
6,358,378 B2 * 3/2002 Choi et al. ............... 204/192.15

FOREIGN PATENT DOCUMENTS

EP          0 863 555 A2  *  9/1998
JP          54-162688 A       12/1979
JP          8-228398 A     *  9/1996

OTHER PUBLICATIONS

Bae et al., "Pulsed laser deposition of ZnO thin films for applications of light emission", Applied Surface Science, 154–155 (2000) 458–461.*
Yamauchi et al. "Low temperature epitaxial growth of ZnO layer by plasma–assisted epitaxy", Thin Solid Films 345 (1999) 12–17.*

* cited by examiner

Primary Examiner—Steven Loke
Assistant Examiner—Donghee Kang
(74) Attorney, Agent, or Firm—Frishauf, Holtz, Goodman & Chick, P.C.

(57) ABSTRACT

A ZnO crystal growing method having the steps of: growing a low temperature growth ZnO layer on a sapphire substrate at a temperature lower than a single crystal ZnO growth temperature; thermally processing the low temperature growth ZnO layer at a temperature near to a growth temperature of a high temperature growth single crystal ZnO layer higher than the growth temperature low temperature growth ZnO layer; and growing a high temperature growth single crystal ZnO layer on the low temperature growth ZnO layer at a temperature higher than the growth temperature of the of the low temperature growth ZnO layer. ZnO crystal of good quality with a reduced number of crystal defects can be grown on a sapphire substrate.

16 Claims, 6 Drawing Sheets

ZNO CRYSTAL GROWTH METHOD, ZNO CRYSTAL STRUCTURE, AND SEMICONDUCTOR DEVICE USING ZNO CRYSTAL

This application is based on Japanese Patent Application HEI 11-245220, filed on Aug. 31, 1999, the entire contents of which are incorporated herein by reference.

BACKGROUND OF THE INVENTION a) Field of the Invention

The present invention relates to ZnO crystal, its growth method, and semiconductor device using ZnO crystals.

b) Description of the Related Art

ZnO can be grown directly on a sapphire substrate by using, for example, RS-MBE (radical source—molecular beam epitaxy). As a Zn source, a Zn solid source in K cell (Knudsen cell) is used. As an O source, oxygen radicals are used which are generated from an oxygen gas source by using RF (radio frequency), ECR (electron cyclotron resonance) or the like.

RF-MBE uses a high frequency of 13.56 MHz most popularly used in commercial systems. O radicals are generated by introducing $O_2$ source gas into an electrodeless discharge tube in an MBE chamber. O radicals are jetted out into the MBE chamber, forming a O radical beam. A ZnO thin film can be grown by radiating an O radical beam and a Zn beam from a K cell to a sapphire substrate at the same time.

Semiconductor devices such as LED (light emitting diodes) and LD (laser diodes) having a p-n junction can be manufactured by using ZnO which is one of group II–V compound semiconductor.

Crystallinity of semiconductor crystal material of semiconductor devices such as LED and LD greatly influences the electric characteristics, optical characteristics and reliability (life time) of semiconductor devices. The better the crystallinity of semiconductor crystal material of a semiconductor device, the better the electric characteristics, optical characteristics and reliability of semiconductor devices.

Conventional ZnO crystal grown directly on a sapphire substrate by RS-MBE is associated with the following problems. A difference of lattice constant between a sapphire substrate and ZnO (a lattice constant mismatch is about 18%) large. A large difference of thermal expansion coefficient therebetween is also as large as about 2.6 times.

Many crystal defects are introduced into grown ZnO crystal.

FIG. 7 shows XRC (X-ray rocking curve) measurement results of ZnO (0002) crystals directly grown on a sapphire (0001) substrate. ZnO crystal was grown by RS-MBE under the conditions of a growth temperature Tg of 650° C., a Zn partial pressure $P_{zn}$ of $1 \times 10^{-7}$ Torr, an oxygen flow rate $O_2$ of 2 sccm, and an RF output of 300 W.

A curve of approximately normal distribution having a peak intensity at an omega angle of near 17.5 degrees was observed as seen from XRC measurement results. A full width at half maximum (FWHM) was as large as 0.5° (1800 arcsec). It was found from the measurement results shown in FIG. 7 that the crystallinity of ZnO crystal grown under the above-described conditions was not good.

FIG. 8 shows PL (photo luminescence) measurement results of ZnO crystal grown under the above-described conditions. The abscissa represents an energy of PL output light. A sharp peak with a high intensity and always with a narrow FWHM was observed at an energy of near 3.35 eV. The peak energy value of PL is generally coincident with a forbidden band (3.3 eV) of ZnO. This can be considered as a radiation peak to be caused by recombination of electrons and holes between the conductive band and valence band.

A broad peak was also observed in an energy range from about 1.8 eV to about 2.7 eV. This broad peak can be considered as radiation between deep levels existing in the forbidden band. This suggests that ZnO crystal has many crystal defects.

SUMMARY OF THE INVENTION

It is an object of the present invention to provide a crystal growth method capable of growing good ZnO crystal on a sapphire substrate while reducing crystal detects in ZnO crystal.

It is another object of the present invention to provide ZnO crystal to be grown on a sapphire substrate, and a semiconductor device using ZnO crystal.

According to one aspect of the present invention, there is provided a ZnO crystal growing method comprising the steps of: growing a low temperature growth ZnO layer on a sapphire substrate at a temperature lower than a single crystal ZnO growth temperature; thermally processing the low temperature growth ZnO layer at a temperature near to a growth temperature of a high temperature growth single crystal ZnO layer higher than the growth temperature of the low temperature growth ZnO layer; and growing a high temperature growth single crystal ZnO layer on the: low temperature growth ZnO layer at a temperature higher than the growth temperature of the low temperature growth ZnO layer.

Single crystal ZnO having good crystallinity can be grown on a sapphire substrate.

DETAILED DESCRIPTION OF THE PREFERRED EMBODIMENTS

Embodiments of the invention will be described with reference to the accompanying drawings.

A "growth temperature of a low temperature growth ZnO layer" defined in this specification is generally a temperature lower by about 100° C. to about 400° C. than a growth temperature at which ZnO single crystal is grown, e.g., a temperature in a range from about 200° C. to about 600° C. A "growth temperature of a high temperature growth single crystal ZnO layer" is generally a growth temperature suitable for growing ZnO single crystal, higher than the "growth temperature of the low temperature growth ZnO layer" and lower than 800° C., e.g., 650° C.

Figure 1:
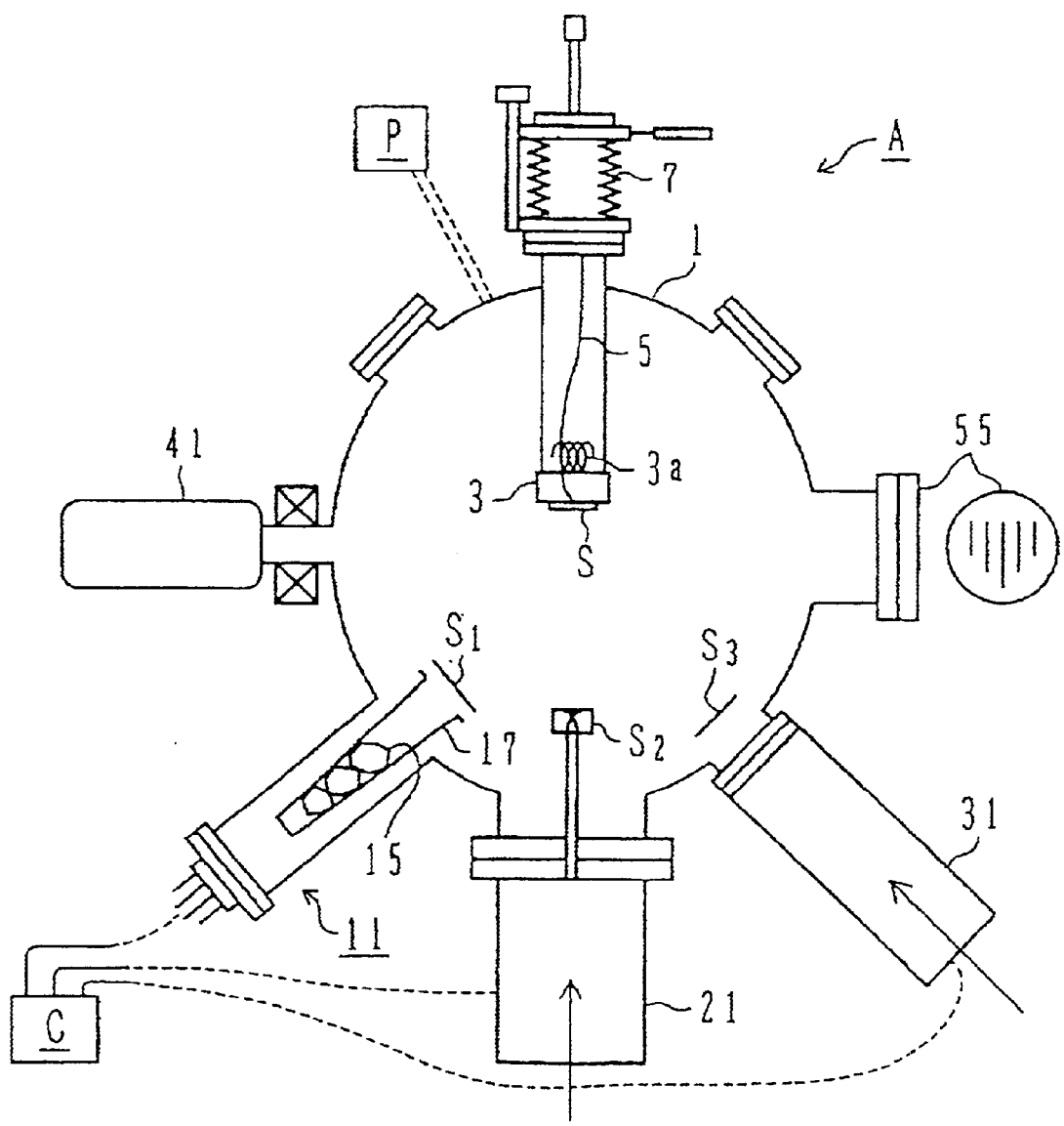
FIG. 1 is across sectional view of an MBE system to be used for performing a crystal growth method according to a first embodiment of the invention.
Figure 2:
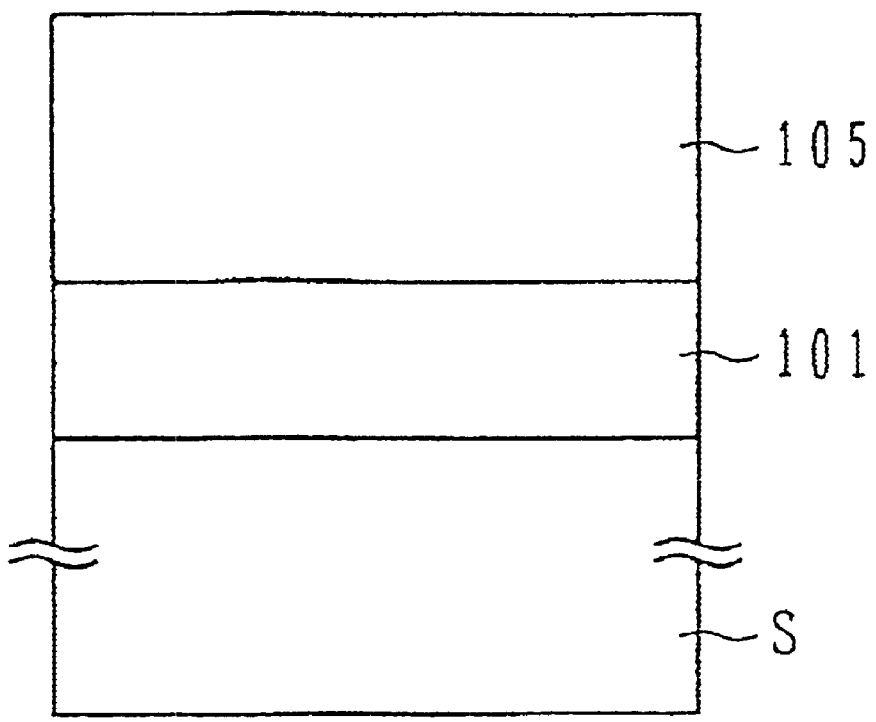
FIG. 2 shows a lamination structure of sapphire substrate/ low temperature growth ZnO buffer laying temperature growth ZnO single crystal layer, formed by the crystal growth method of the first embodiment.

With reference to FIGS. 1 and 2, a method of growing group II-VI compound semiconductor single crystal according to a first embodiment of the invention will be described.

As one example of a system for growing group II-VI compound semiconductor single crystal, a crystal growth system using radical source molecular beam epitaxy (RS-MBE) (hereinafter called an "RS-MBE system") is shown in FIG. 1.

The RS-MBE system A has a chamber 1 in which crystal is grown and a vacuum pump P for maintaining the inside of the chamber 1 in an ultra high vacuum state.

The chamber 1 has a Zn port 11 for evaporating Zn, an O radical port 21 for radiating O radicals, and an N radical port 31 for radiating N radicals.

The Zn port 11 has a Knudsen cell (hereinafter called a K cell) 17 for accommodating Zn source material (purity: 7N) 15 and heating and evaporating it, and a shutter $S_1$.

The O radical port 21 jets out O radicals into the MBE chamber 1, the O radicals being generated by introducing oxygen source gas into an electrodeless discharge tube and applying high frequency waves (13.56 MHz). An orifice $S_2$ is formed through which an O radical beam passes.

The N radical port 31 jets out N radicals into the MBE chamber 1, the N radicals being generated by introducing nitrogen source gas into an electrodeless discharge tube and applying high frequency waves (13.56 MHz). A shutter $S_3$ is formed through which an N radical beam passes.

The radical ports 21 and 31 have the structure that an induction coil is wound about the outer surface of the discharge tube mounted in an outer shield tube.

A substrate holder 3 and a heater 3a are mounted in the chamber 1. The substrate holder 3 holds a sapphire substrate S which is used as an underlie of grown crystal.

The heater 3a heats the substrate holder 3. A temperature of the sapphire substrate S can be measured with a thermostat 5. The substrate holder 3 can be moved by a manipulator 7 using bellows.

The chamber 1 has a gun 41 of a reflection electron beam diffraction apparatus (RHEED apparatus) for monitoring a grown crystal layer, and a screen 55 of the RHEED apparatus. By using the gun 41 and screen 55 of the RHEED apparatus, crystal can be grown in the MBE system A by monitoring the crystal growth state (growth amount, quality of a grown crystal layer).

A temperature of crystal growth, a thickness of a grown crystal layer, a vacuum degree in the chamber, and the like can be properly controlled by a controller C.

Processes of growing ZnO on the sapphire substrate S will be described in detail.

Crystal growth is performed by RS-MBE while the open/close of the shutters $S_1$ to $S_3$ is properly controlled.

RF-MBE using RF waves is used as a method of generating source radicals. O radicals are generated by introducing $O_2$ source gas into the electrodeless discharge tube and using high frequency waves at 13.56 MHz. O radicals are jetted out into the MBE chamber 1 in a high vacuum state as an O radical beam. By radiating the O radical beam and a Zn beam from the K cell upon the sapphire substrate S at the same time, a ZnO thin film can be grown.

FIG. 2 shows the outline of a semiconductor crystal structure according to the embodiment.

A ZnO buffer layer 101 is formed on a sapphire (0001) substrate S, and a ZnO single crystal layer 105 is formed on the ZnO buffer layer 101.

Processes of forming the structure shown in FIG. 2 will be described briefly.

First, ZnO is grown on the sapphire substrate S at a low growth temperature under the Zn rich condition. In the state that O radicals are radiated, the substrate temperature is raised to a general growth temperature suitable for growing ZnO single crystal. This state is maintained, for example, about 20 minutes. This high temperature process planarizes the surface of the low temperature growth ZnO layer. In this manner, the buffer layer 101 is formed. The ZnO single crystal layer 105 is grown on this buffer layer 101.

The buffer layer 101 relaxes a lattice mismatch and a large thermal expansion coefficient difference between the sapphire substrate S and ZnO single crystal layer 105, the lattice mismatch being caused by a large difference of a lattice constant between the substrate S and ZnO single crystal layer. The buffer layer 101 therefore prevents crystal strain from entering the ZnO single crystal layer 105.

The surface states of ZnO buffer layers 101 were observed through atomic force microscopy (AFM).

The surface of a buffer layer 101 grown under the Zn rich condition was compared with the surface of a buffer layer 101 grown under the O rich condition.

Zn rich ZnO crystal is represented by $ZnO_{1-x}$ where x is smaller than 1.

Flatness of the surface of a ZnO buffer layer 101 grown under the Zn rich condition is improved more than that of the surface of a ZnO buffer layer grown under the O rich condition, as viewed through AFM. The low temperature growth ZnO buffer layer grown either under the O rich condition or under the Zn rich condition is single crystal having grain boundaries.

The details of the crystal growth method are given in the following.

The (0001) plane of the sapphire substrate S was wet-etched for 60 minutes in solution of $H_3PO_4:H_2SO_4=1:3$.

After this surface processing, the sapphire substrate S was mounted on the substrate holder 3 (FIG. 1).

The surface of the substrate S was processed for one hour by oxygen plasma in the MBE system, under the conditions of a substrate temperature of 550° C., an oxygen flow rate of 2 sccm and an RF power of 150 W. With this surface processing of the sapphire substrate S in the MBE system, the surface of the sapphire substrate S was cleaned.

After this surface processing of the sapphire substrate, the buffer layer 101 was grown under the low temperature and Zn rich condition (low growth temperature ZnO layer), as different from the growth condition of a general single crystal ZnO substrate. The partial pressure of Zn was introduced at $2.7 \times 10^{-7}$ Torr.

RF plasma source of O was used as an oxygen beam source. Pure oxygen (purity: 6N) gas was introduced into the O radical port 21 to generate O radicals by using an RF oscillation source.

The oxygen gas source was introduced at a flow rate of 1.5 sccm under the conditions of an oxygen partial pressure of $5 \times 10^{-5}$ Torr in the chamber and an RF power of 300 W. The growth temperature was set in a range from 300° C. to 600° C. The thickness of the buffer layer was set in a range from 10 nm to 100 nm.

The oxygen partial pressure was measured with a nude ion gauge mounted on the substrate holder (at the growth position).

Figure 3:
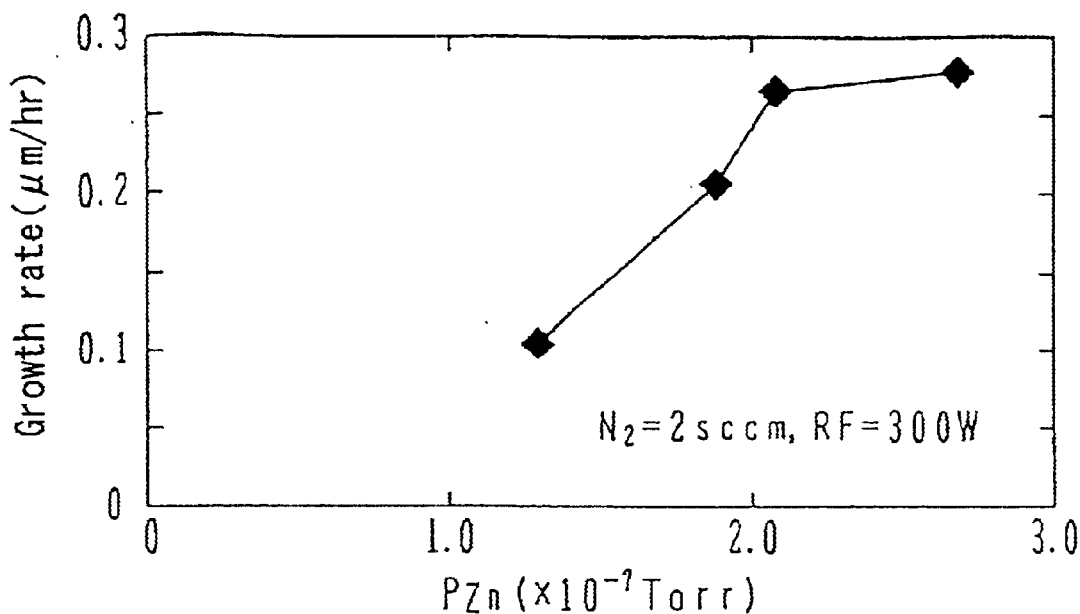
FIG. 3 is a graph showing a relation between a Zn partial pressure and a growth speed of a ZnO single crystal layer grown at a high growth temperature of 650° C.

FIG. 3 is a graph showing the relation between a Zn partial pressure ($P_{zn}$) and a growth temperature at a substrate temperature Tg of 650° C. $N_2$ was flown at 2 sccm, and the RF output was 300 W. The Zn partial pressure was changed from $1.3 \times 10^{-7}$ Torr to $2.7 \times 10^{-7}$ Torr.

As the Zn partial pressure was increased from $1.3 \times 10^{-7}$ Torr to $2.15 \times 10^{-7}$ Torr, the ZnO growth speed was increased from 0.10 $\mu$m/hr to 0.26 $\mu$m/hr. The ZnO growth speed in the Zn partial pressure range from $2.15 \times 10^{-7}$ Torr to $2.7 \times 10^{-7}$ Torr took an approximately constant value in a range from 0.26 $\mu$m/hr to 0.27 $\mu$m/hr.

After the low temperature growth ZnO buffer layer was grown, a process of planarizing the surface of the buffer layer was performed. As this planarizing process, a heat treatment was performed during a period in a range from 2 minutes to 60 minutes, at a high temperature capable of growing single crystal, e.g., 650° C. The low temperature growth ZnO buffer layer 101 is considered as single crystal having grain boundaries, each grain being epitaxially grown to have the same anisotropy. Surface irregularity observed through AFM may be ascribed to such grain boundaries.

It can be considered that the heat treatment of the low temperature grown ZnO buffer layer results in solid-state growth of single crystal in each grain, which increases the grain size and planarizes the surface.

The surface of the buffer layer grown under the Zn rich condition has smaller initial irregularity than the surface of the buffer layer grown under the O rich condition, so that a very flat surface is likely to be obtained by the planarizing process. As a ZnO layer is grown at a high temperature on the low temperature growth ZnO layer having a very flat surface, a single crystal ZnO layer having good crystallinity is likely to be formed.

The temperature at which a low temperature growth ZnO is grown is preferably set in a range from 200° C. to 600° C.

The low temperature ZnO buffer layer has a small grain size in an as grown state and grain boundaries can be observed so that it looks like polycystal through AFM observation. However, it shows single crystal characteristics through X-ray diffraction or RHEED.

This phenomenon can be observed during the growth of GaN and ZnO. Surface planarization may be ascribed to that as the low temperature growth ZnO buffer layer is subjected to a low temperature heat treatment, irregularity caused by grain boundaries grows similar to the case of solid-state growth and the surface is planarized. If single crystal ZnO is grown on an irregular surface of ZnO, crystallinity of the grown single crystal is not good as from past experiences.

Next, a single crystal ZnO layer (high temperature growth ZnO single crystal layer) was grown on the planarized low temperature growth ZnO buffer layer.

The growth conditions were a substrate temperature of 650° C. and a pressure of $8.0 \times 10^{-5}$ Torr during introducing Zn (7N). The oxygen gas source was introduced at a flow rate of 2.0 sccm under the conditions of an oxygen partial pressure of $8 \times 10^{-5}$ Torr in the chamber and an RF power of 300 W.

The high temperature growth ZnO single crystal layer was 1 $\mu$m in thickness.

The high temperature growth ZnO single crystal layer is grown preferably under the conditions of a growth temperature from 600° C. to 800° C. and a growth time from 2 minutes to 60 minutes.

The crystallinity of high temperature growth ZnO single crystal layers grown under the above-described conditions were evaluated.

Figure 4:
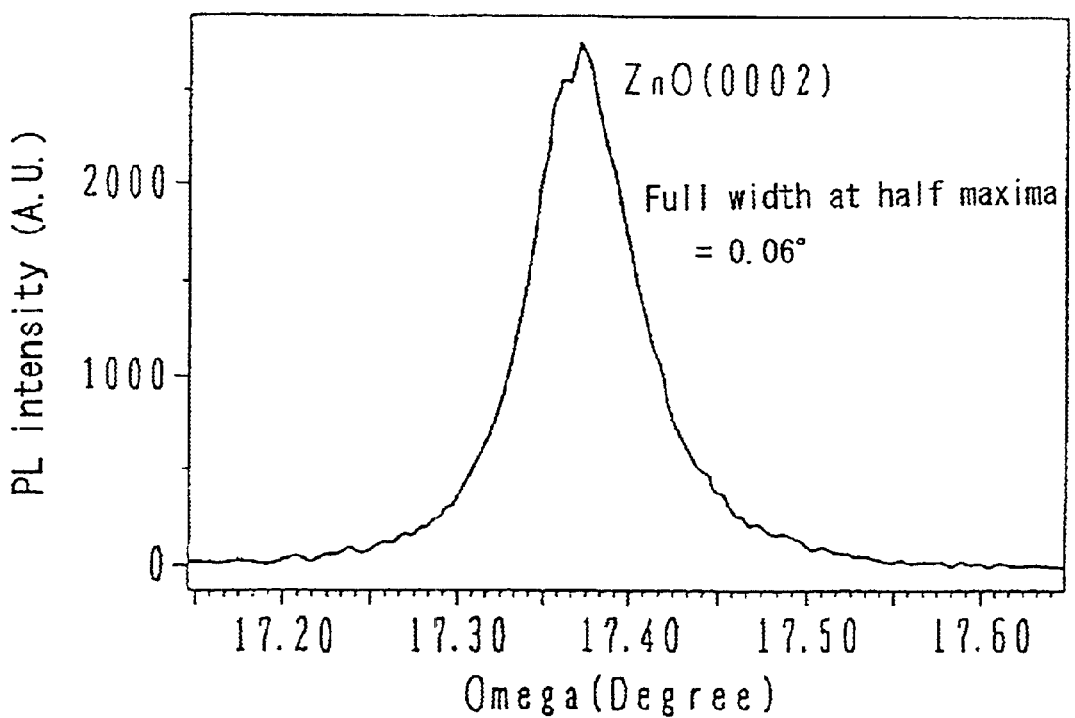
FIG. 4 is a graph showing XRC measurement results of a high temperature growth ZnO single crystal a layer in a lamination structure of sapphire substrate/low temperature growth ZnO buffer layer/high temperature growth ZnO single crystal layer, formed by the crystal growth method of the first embodiment.

FIG. 4 shows XRC measurement results.

Figure 7:
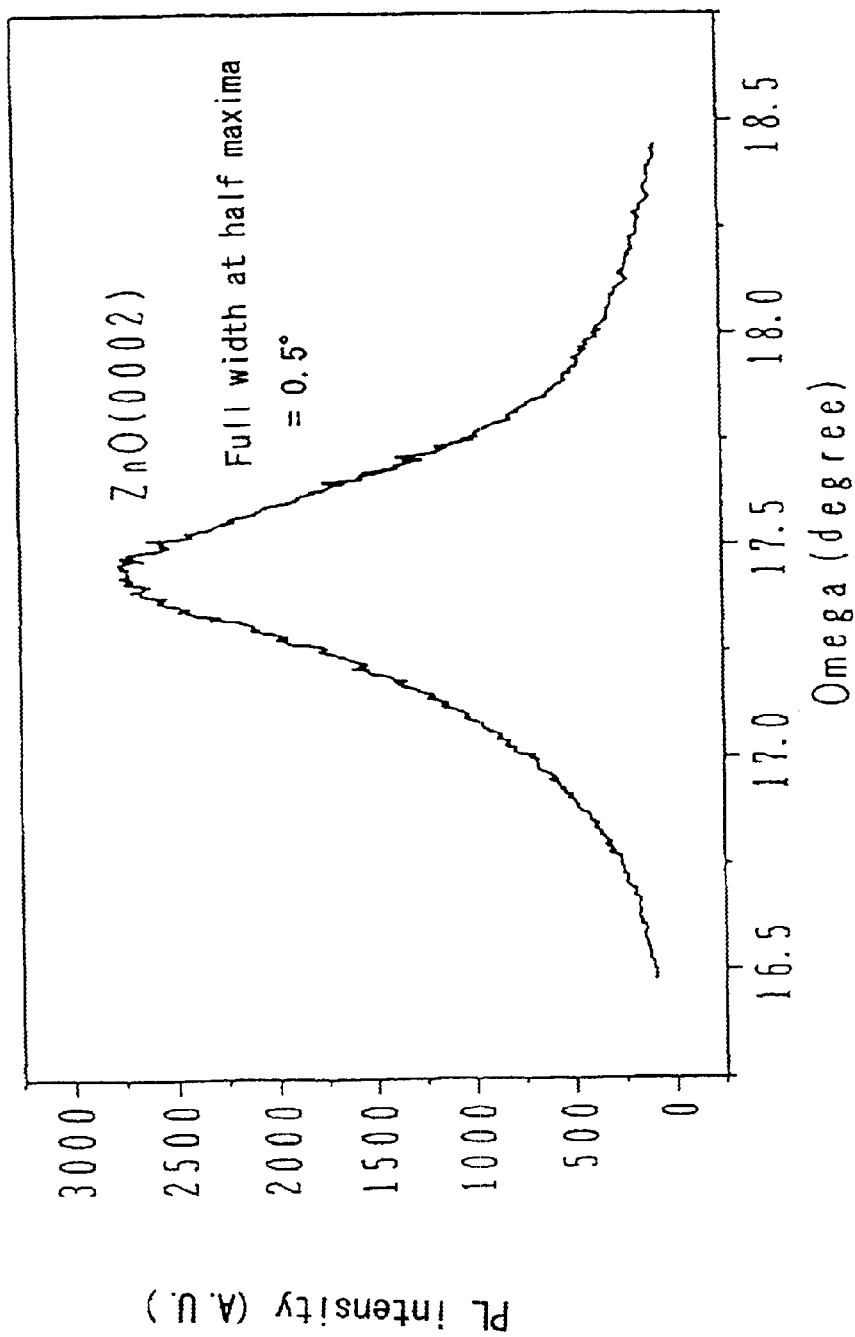
FIG. 7 shows XRC measurement results of a ZnO single crystal layer in a lamination structure of sapphire substrate/ low temperature growth ZnO buffer layer/high temperature growth ZnO single crystal layer, formed by a conventional growth method.

The peak value was 17.35° same as that shown in FIG. 7. The full width at half maximum was 0.06° (216 arcsec) which was about ⅛ of that (0.5°) of ZnO grown under the conventional conditions illustrated in FIG. 7. This great reduction in the full width at half maximum may be ascribed to improved crystallinity of the high temperature growth ZnO single crystal layer grown at a high temperature on the planarized low temperature growth ZnO buffer layer.

Figure 5:
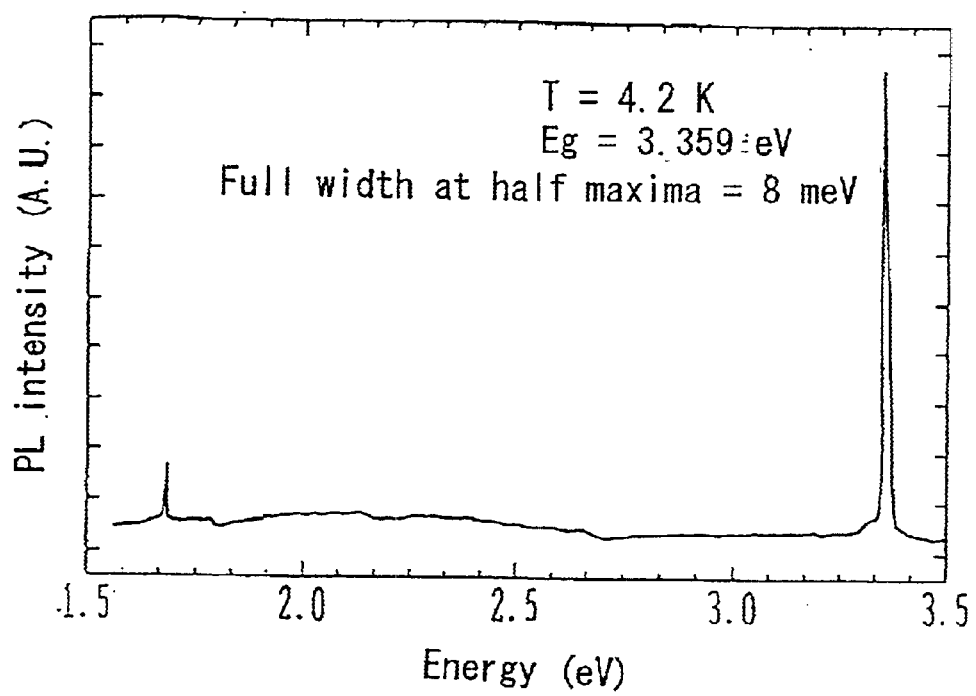
FIG. 5 is a graph showing PL measurement results of a high temperature growth ZnO single crystal layer in the lamination structure of sapphire substrate/low temperature growth ZnO buffer layer/high temperature growth ZnO single crystal layer, formed by the crystal growth method of the first embodiment.

FIG. 5 shows PL spectra of the ZnO single crystal layer.

Figure 8:
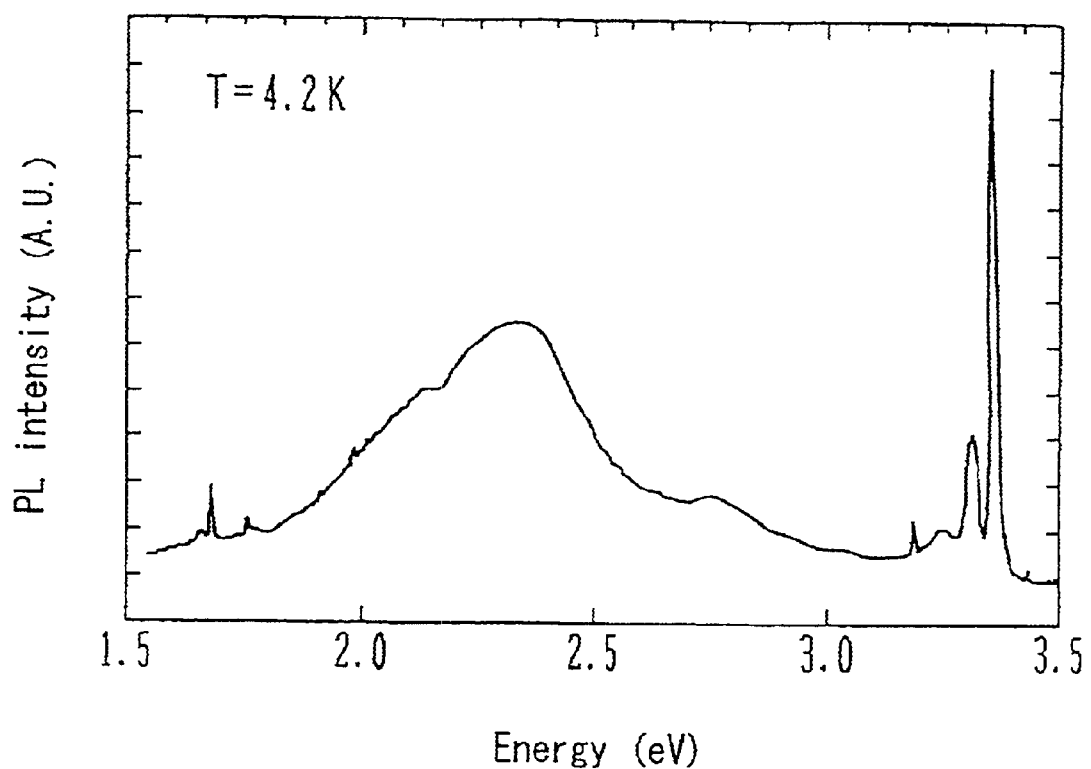
FIG. 8 shows PL measurement results of a high temperature growth ZnO single crystal in the lamination structure of sapphire substrate/low temperature growth ZnO buffer layer/high temperature growth ZnO single crystal layer, formed by the conventional growth method.

A sharp peak was observed at an energy of 3.359 eV. The broad peak of the ZnO single crystal in a range from 1.8 eV to 2.7 eV shown in FIG. 8 and grown on a substrate without the low temperature growth ZnO buffer layer, was not observed. This may be ascribed to reduction of radiation at a deep level existing in the forbidden band of the ZnO layer and hence to greatly improved crystallinity.

If many crystal defects are introduced into ZnO crystal, the ZnO crystal has a strong n-type conductivity even if impurities are not doped. The high temperature growth ZnO single crystal grown by the above-described crystal growth method has only a small number of crystal defects. ZnO single crystal showing a p-type conductivity can also be realized which is difficult to be formed by the conventional crystal growth method. Since the number of crystal defects forming non-radiative centers is reduced considerably, it can be considered that a radiation efficiency is very high.

An LED having a p-n junction made of p-type semiconductor ZnO doped with N impurities and n-type semiconductor ZnO doped with Ga impurities can be realized.

Figure 6:
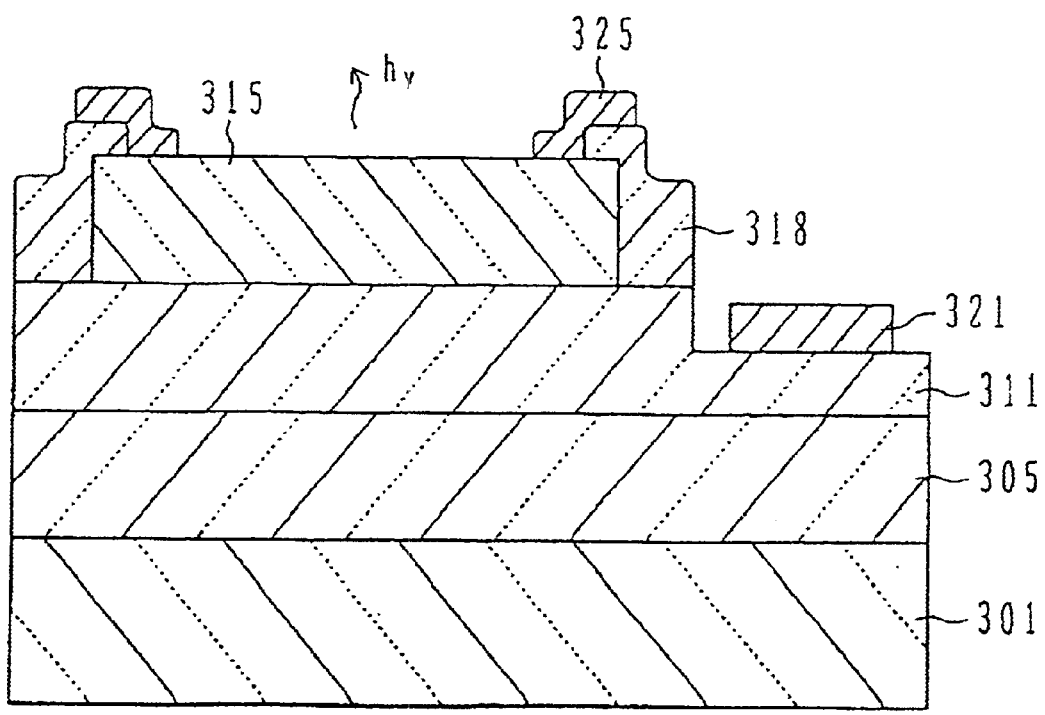
FIG. 6 is a schematic cross sectional view showing the structure of a semiconductor light emitting device (LED) according to a second embodiment of the invention.

FIG. 6 is a cross sectional view showing the structure of an LED having a p-n junction made of p-type semiconductor ZnO doped with N impurities and n-type semiconductor ZnO doped with Ga impurities.

An LED shown in FIG. 6 has: a sapphire substrate 301; a non-doped low temperature growth ZnO buffer layer 305 grown at a low temperature on the sapphire substrate 301 and having a thickness of 100 nm; an n-type (Ga doped to $1 \times 10^{18}$ cm$^{-3}$) high temperature growth ZnO single crystal layer 311 formed on the buffer layer 305 and having a thickness of 1 $\mu$m; and an N-doped p-type high temperature growth ZnO single crystal layer 315 formed on the single crystal layer 311 and having a thickness of 100 nm.

The n-type ZnO layer 311 is electrically connected to a first electrode 321.

Instead of forming the n-type ZnO layer doped with Ga, a group III element such as Al may also be doped.

The N-doped p-type ZnO layer 315 is patterned in an island shape. The island-shaped p-type ZnO layer 315 is covered with an insulating film 318 made of, for example, $Si_3N_4$. An opening having a shape, for example, generally a circular cross section, is formed through the insulating film 318, exposing the upper surface of he p-type ZnO layer 315.

A second electrode 325 of a ring shape is formed in the upper peripheral area of the p-type ZnO layer 315. At least a partial area of the bottom surface of the ring second electrode 325 is made in contact with the upper peripheral area of the p-type ZnO layer 315. The outer radial portion of the second electrode 235 of the ring shape has a structure riding upon the insulating film 318.

Forward current flows through the p-n junction of the LED having the structure described above, when a positive voltage is applied to the first electrode 321 relative to the second electrode 235. Radiative recombination occurs between minority carriers (electrons) and majority carriers (holes) injected into the p-type ZnO layer 315. When electrons and holes are recombined, light having an energy approximately equal to the energy gap of the forbidden band is radiated from the opening. Namely, electric energy was transformed into optical energy.

With this operation, light having a wavelength of, for example, about 370 nm, is emitted from the opening in the ring second electrode 235 of LED.

In this embodiment, LED is used as an example of the semiconductor device using the p-n junction of the p-type ZnO layer and n-type ZnO layer. A laser may be formed by a combination of the p-type ZnO layer and n-type ZnO layer. Obviously, this combination may be used for other electronic devices such as FETs and bipolar transistors, other optical components, and semiconductor devices made of a combination of electronic devices and optical components.

Semiconductor crystals and semiconductor devices may be made of three- or four-element compound crystal of ZnO series including ZnO single crystal having good crystallinity.

The present invention has been described in connection with the preferred embodiments. The invention is not limited only to the above embodiments. Crystal growth conditions and other process parameters may be selected in various ways. It is apparent that various modifications, improvements, combinations, and the like can be made by those skilled in the art.

What is claimed is:

1. A ZnO crystal structure comprising:
   (a) a sapphire substrate;
   (b) a low temperature growth ZnO single crystal layer formed on said sapphire substrate at a temperature lower than a conventional single crystal ZnO growth temperature so that in an as-deposited state, said low temperature growth ZnO single crystal layer has grain boundaries that are observable in atomic force microscopy, but shows single crystal characteristics in X-ray detraction or reflection electron beam diffraction, and subjected to a surface planarizing process at a temperature capable of growing single crystals so that the grain size increases and the surface is planarized; and
   (c) a high temperature growth ZnO single crystal layer formed on said low temperature growth ZnO single crystal layer at a temperature suitable for growing a single crystal so that said high temperature growth single crystal layer shows a narrower XRC peak at the same diffraction angle and a lower broad peak of PL spectra than a layer grown without the low temperature growth ZnO single crystal layer.

2. A ZnO crystal structure according to claim 1, wherein said low temperature growth ZnO single crystal layer is grown at a temperature lower than 600° C., and said high temperature growth ZnO single crystal layer is grown at a temperature higher than the temperature for said low temperature growth ZnO single crystal layer and lower than 800° C.

3. A ZnO crystal structure according to claim 1, wherein a thickness of said low temperature growth ZnO single crystal layer is in a range from 10 nm to 100 nm.

4. A ZnO crystal structure according to claim 1, wherein said low temperature growth ZnO single crystal layer is grown at a temperature lower than 600° C., said high temperature growth ZnO single crystal layer is grown at a temperature higher than the temperature for said low temperature growth ZnO single crystal layer and lower than 800° C., and a thickness of said low temperature growth ZnO single crystal layer is in a range from 10 nm to 100 nm.

5. A ZnO crystal structure according to claim 1, wherein said high temperature growth ZnO single crystal layer is a ZnO layer having an n-type conductivity doped with Ga or Al.

6. A ZnO crystal structure according to claim 1, wherein said high temperature growth ZnO single crystal layer is a ZnO layer having a p-type conductivity doped with N.

7. A ZnO crystal growing method for producing the ZnO crystal according to claim 1, comprising the steps of:
   (a) growing a low temperature growth ZnO layer on a sapphire substrate at a temperature lower than a single crystal ZnO growth temperature;
   (b) thermally processing the low temperature growth ZnO layer from step (a) at a temperature near to a growth temperature of a high temperature growth single crystal ZnO layer which is higher than a growth temperature of the low temperature growth ZnO layer; and
   (c) growing a high temperature growth single crystal ZnO layer on the low temperature growth ZnO layer at a temperature higher than the growth temperature of the low temperature growth ZnO layer.

8. A ZnO crystal growing method according to claim 1, wherein said step of growing the low temperature growth ZnO layer is a process of growing ZnO single crystal at a temperature in a range from 200° C. to 600° C.

9. A ZnO crystal growing method according to claim 1, wherein said step of thermally processing the low temperature growth ZnO layer at the temperature near to the growth temperature of the high temperature growth single crystal ZnO layer is a process of thermally processing the low temperature growth ZnO layer at a temperature in a range from 600° C. to 800° C. during a period in a range from 2 minutes to 60 minutes.

10. A ZnO crystal growing method according to claim 1, wherein said step of growing the low temperature growth ZnO layer is a process of growing ZnO single crystal at a temperature in a range from 200° C. to 600° C., and said step of thermally processing the low temperature growth ZnO layer at the temperature near to the growth temperature of the high temperature growth single crystal ZnO layer is a process of thermally processing the low temperature growth ZnO layer at a temperature in a range from 600° C. to 800° C. during a period in a range from 2 minutes to 60 minutes.

11. A ZnO crystal growing method according to claim 1, wherein said step of growing the low temperature growth ZnO layer is a gas-phase growth precess under a Zn rich condition.

12. A semiconductor device comprising:

(a) a sapphire substrate;

(b) a low temperature growth ZnO single crystal layer formed on said sapphire substrate at a temperature lower than a conventional single crystal ZnO growth temperature so that in an as-deposited state, said low temperature growth ZnO single crystal layer has grain boundaries that are observable in atomic force microscopy, but shows single crystal characteristics in X-ray defraction or reflection electron beam diffraction, and subjected to a surface planarizing process at a temperature capable of growing single crystals so that the grain size increases and the surface is planarized; and (c) a high temperature growth ZnO crystal layer formed on said low temperature growth ZnO single crystal layer at a temperature suitable for growing a single crystal so that said high temperature growth ZnO crystal layer shows a narrower XRC peak at the same diffraction angle and a lower broad peak of PL spectra than a layer grown without the low temperature growth ZnO single crystal layer, said high temperature growth ZnO single crystal layer having a p-n junction made of a first ZnO region having an n-type conductivity doped with Ga or Al and a second ZnO region having a p-type conductivity doped with N.

13. A semiconductor device according to claim 12, wherein the first ZnO region having the n-type conductivity is used as an optical surface.

14. A semiconductor device according to claim 12, wherein the second ZnO region having the p-type conductivity is used as an optical surface.

15. A semiconductor device according to claim 12, wherein the ZnO layer having an n-type conductivity is doped with Ga.

16. A semiconductor device according to claim 12, wherein the ZnO layer having an n-type conductivity is doped with Al.

* * * * *

UNITED STATES PATENT AND TRADEMARK OFFICE
CERTIFICATE OF CORRECTION

PATENT NO. : 6,664,565 B1
DATED : December 16, 2003
INVENTOR(S) : Michihiro Sano et al.

It is certified that error appears in the above-identified patent and that said Letters Patent is hereby corrected as shown below:

Column 8,
Lines 46, 50 and 58, replace "1" with -- 7 --.

Column 9,
Line 1, replace "1" with -- 7 --.

Signed and Sealed this

Twenty-first Day of February, 2006

JON W. DUDAS
*Director of the United States Patent and Trademark Office*